United States Patent [19]

Uchida

[11] Patent Number: 5,545,697
[45] Date of Patent: Aug. 13, 1996

[54] URETHANE MODIFIED EPOXY RESIN COMPOSITIONS

[75] Inventor: Hiroshi Uchida, Kurashiki, Japan

[73] Assignee: Ciba-Geigy Corporation, Tarrytown, N.Y.

[21] Appl. No.: 196,347

[22] Filed: Feb. 14, 1994

[51] Int. Cl.$^6$ ................................................ C08L 71/02
[52] U.S. Cl. .................. 525/403; 525/407; 525/452; 525/455; 525/461; 528/63; 528/64; 528/65; 528/84; 528/85; 528/87; 528/93; 528/102
[58] Field of Search ............... 528/63, 64, 65, 528/84, 85, 87, 93, 102; 525/430, 407, 452, 455, 461

[56] References Cited

U.S. PATENT DOCUMENTS

| | | | |
|---|---|---|---|
| 3,979,365 | 9/1976 | Tanaka et al. | 260/77.5 |
| 4,070,416 | 1/1978 | Narahara et al. | 260/830 |
| 5,112,932 | 5/1992 | Koenig et al. | 528/51 |

FOREIGN PATENT DOCUMENTS 3229772  2/1993  Japan.

OTHER PUBLICATIONS

H. Kakiuchi's "Shin–Epoxy Jushi (New Epoxy Resins)" published by Shokodo, 1985, pp. 49–104.
H. Kakiuchi's "Epoxy Jushi–Saikin No Shinpo (Epoxy Resins–Recent Advancement)", published by Shokodo, 1990, pp. 21–46.
Japanese Industrial Standard, K–7236–1986, pp. 1–6.
Japanese Industrial Standard, K–7113–1981, pp. 1–16.
ASTM D1002–72, pp. 47–50 (Jul., 1972).
ASTM D1876–93, pp. 1–3 (Jan. 1993).

*Primary Examiner*—James J. Seidleck
*Assistant Examiner*—Duc Truong
*Attorney, Agent, or Firm*—William A. Teoli, Jr.; David R. Crichton

[57] ABSTRACT

An epoxy resin composition characterized by comprising (A) an epoxy resin containing an oxazolidone ring, (B) a halogen-containing epoxy resin and (C) a curing agent as its ingredients, wherein the ratio by weight of ingredients (A) to (B) is 5–100:95-0, the hydrolizable chlorine content of ingredients (A) and (B) is no more than 500 ppm and the amount of $\alpha$-glycol is no more than 100 m eq/kg has excellent properties and can be employed as the materials for electronic applications and as paints, adhesives, molding materials, composite materials, laminates and sealing materials.

10 Claims, No Drawings

URETHANE MODIFIED EPOXY RESIN COMPOSITIONS

The composition of the present invention relates to an epoxy resin composition employed as the materials such as for electronic appliances and as paints, adhesives, molding materials, composite materials, laminates and sealing materials.

In the field of electronic appliance materials, with the development of electronic appliances having higher functions and smaller sizes, higher density packaging of LSI (large scale integration) is progressing, and thus the resin materials for the laminates employed for such application are strongly desired to have heat resistance, flame retardancy, adhesion with metal foil circuits, while the resin varnishes and prepregs in the process for forming laminates are also desired to have higher storage stability.

As the resin materials employed here, epoxy resins are predominantly used in view of adhesion with the metal foil circuits.

The laminate is formed by preparing prepregs by impregnating substrates with a varnish prepared by mixing an epoxy resin with a curing agent and by drying, layering the prepregs and then subjecting the thus layered prepregs to pressure molding under heating.

In this process, the varnish containing an epoxy resin and a curing agent seriously affects the quality of the resulting prepregs, unless the quality of the varnish is stable during the formation of prepregs. Further, while the prepregs are stored as such until they are subjected to such lamination and molding, they should have stable quality during the storage. Particularly, if the storage stability of prepregs is improved conspicuously, it is expectable to store the prepregs at room temperature for a long time.

Accordingly, in the epoxy resin varnishes and prepregs employable for laminates, excellence in the storage stability thereof is an important characteristic.

Likewise, in the field of electronic appliances, sealing resin materials having heat resistance, flame retardancy and adhesion are strongly desired, as electronic appliances having higher functions and smaller sizes are developed.

In the field of adhesives, resin materials having tenacity, heat resistance and flame retardancy in addition to the adhesion of its own are highly desired, as aircraft, automobiles, vehicles, electronic appliances, buildings, civil engineering structures, space shuttles, etc. having smaller sizes and lighter weights are developed.

In the field of coatings including powder coating, insulating powder coating, PCM (precoated metal) coating and metallic coating, resins having adhesion to materials and tenacity are earnestly desired.

In the field of composite materials, resins having tenacity and heat resistance are highly desired as merchandises are required to have high quality as indispensable conditions such as unique characteristics and higher functions.

Further, in the field of casting materials including insulating materials for power appliances, resin materials having heat resistance and tenacity are strongly desired, from the necessity of developing appliances having larger sizes and higher functions.

Meanwhile, from the standpoint of safety, flame-retardant epoxy resins are recently employed widely in the industrial field. In order that the epoxy resin can exhibit flame retardancy, the resin should generally contain 20% by weight of bromine per resin. Accordingly, epoxy resins having low bromine contents of 20 to 25% by weight have usually been employed, but they suffer a problem that they have low heat resistance, although they may have excellent flame retardancy and adhesion.

Under such circumstances, while it is attempted to add a novolak epoxy resin to a low-bromine content epoxy resin with a view to improving heat resistance, the addition of such novolak epoxy resin not only tends to reduce the strength of the resin material, but also reduces the pot life of the composition. Accordingly, the loadings of the novolak epoxy resin is inevitably restricted from the necessity of maintaining the bromine content for securing flame retardancy, leading to insufficiently improved heat resistance.

Meanwhile, a high-bromine content epoxy resin, such as a tetrabromobisphenol A epoxy resin and a brominated phenol novolak epoxy resin, is sometimes added as a means of enhancing flame retardancy. However, addition of such resin is almost useless for improving heat resistance.

For example, in laminate manufacturing, the epoxy resin is immersed in a solder bath, when electronic parts such as LSI are mounted thereon, so as to connect the metal circuit formed on the laminate with the electronic parts. A large amount of bromine ff contained in the epoxy resin gives a rise to problems such as liberation of bromine during the immersion, leading to reduction of so-called soldering heat resistance causing metal foil blistering and the like.

While the bromine content may be reduced for improving soldering heat resistance, a bromine content of about 20 wt % is necessary so that the epoxy resin can exhibit flame retardancy, and thus such formulation of epoxy resin compositions have been employed.

As an example of improving heat resistance of a laminate, a resin composition prepared from a polyfunctional epoxy compound and a polyfunctional isocyanate compound is described in Japanese Patent Publication No. 31000/1977. Since the thus obtained resin is highly hygroscopic due to the great excess of isocyanate groups employed relative to the epoxy groups, and the composition is readily reactive with the moisture in air, they must be preserved in hermetically sealable containers so as to maintain their storage stability, disadvantageously.

Meanwhile, Japanese Patent Publication No. 15757/1978 describes an example of resin composition for electric rotary appliances, which is prepared using a diepoxy compound and a diisocyanate compound to obtain a diisocyanate-modified epoxy resin in a first-step reaction, followed by a curing reaction using the diisocyanate compound again as a curing agent. The resulting resin composition is unusable as the resin material for electronic appliances, since the resin composition after curing assumes high hygroscopicity due to the diisocyanate compound incorporated as the curing agent to accelerate liberation of a trace of impurity chlorine contained in the epoxy resin, which affects the electric circuit, disadvantageously.

While resin compositions having particularly well-balanced heat resistance and tenacity, i.e. having improved heat resistance and improved tenacity, are desired widely in various fields as described above, no such resin composition has yet been realized.

Under such circumstances, this invention is directed to provide a highly reliable laminate epoxy resin composition having excellent heat resistance, tenacity, storage stability and, as necessary, flame retardancy.

The present inventors made intensive studies with a view to developing an epoxy resin having excellent performances as described above to find that an epoxy resin composition consisting of (A) an epoxy resin having a specific oxazolidone ring (hereinafter referred to as component (A) resin), (B) a specific halogen-containing epoxy resin (hereinafter referred to as component (B) resin) and (C) a curing agent, and also having specific properties constitutes an excellent resin material for applications where heat resistance, tenacity and storage stability are required, and they accomplished this invention.

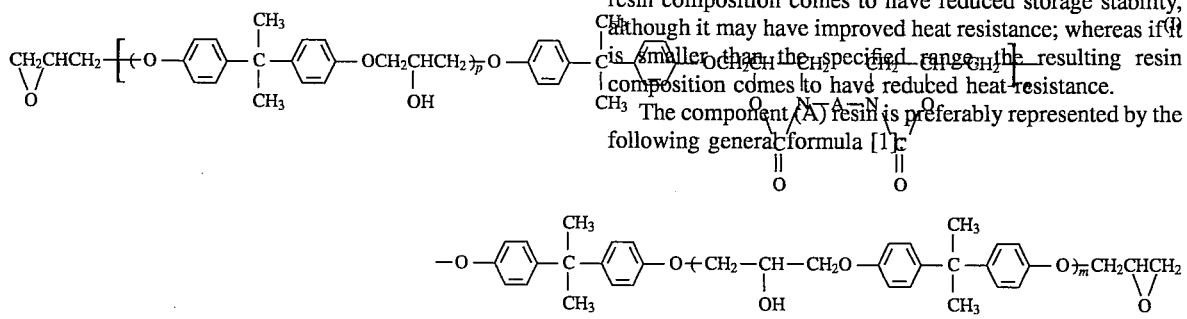

Accordingly, the present invention provides an epoxy resin composition characterized by comprising (A) an epoxy resin containing an oxazolidone ring, (B) a halogen-containing epoxy resin and (C) a curing agent as its ingredients, wherein the ratio by weight of ingredients (A) to (B) is 5-100:95-0, the hydrolizable chlorine content of ingredients (A) and (B) is no more than 500 ppm and the amount of α-glycol is not more than 100 meq/kg.

Namely, the present composition exhibits excellent tenacity and storage stability because of the oxazolidone rings incorporated thereto, excellent heat resistance and excellent adhesion to metal circuits because of the oxazolidone rings and the epoxy groups both incorporated in optimum amounts and surprising flame retardancy because of the synergistic effect brought about by the oxazolidone rings and the halogen atoms both incorporated in optimum amounts, and thus the halogen content can be reduced. Accordingly, a composition having heat resistance, as well as excellent insulating property and waterproofing property depending on the specific properties of the respective components can be provided.

This invention will be described below more specifically.

In the resin composition of the invention, the epoxy equivalent of the component (A) resin is preferably 200 to 10000 g/eq, more preferably 250 to 2000 g/eq. If the epoxy equivalent thereof is smaller than the specified range, the resulting resin composition comes to have insufficient heat resistance and storage stability; whereas if it is greater than the specified range, the resin composition comes to exhibit reduced adhesion.

The epoxy equivalent of the component (B) resin is preferably 200 to 2000 g/eq, more preferably 250 to 700 g/eq. If the epoxy equivalent is smaller than the specified range, the resulting resin composition comes to exhibit insufficient adhesion; whereas if it is greater than the specified range, the resin composition comes to have reduced storage stability and heat resistance.

In the resin composition of the invention, the component (A) resin contains epoxy group having a functionality of at least one epoxy group per molecule, preferably an epoxy functionality of 1.2 to 5 on an average per molecule, more preferably an epoxy functionality of 1.2 to 3 on an average per molecule.

If the functionality of the epoxy group in the component (A) resin is greater than the specified range, the resulting resin composition comes to have reduced storage stability, although it may have improved heat resistance; whereas if it is smaller than the specified range, the resulting resin composition comes to have reduced heat resistance.

The component (A) resin is preferably represented by the following general formula [1]

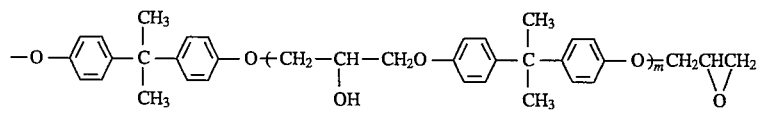

wherein p, m and n each represent an average number of recurring unit; and p is 0 to 100, m is 0 to 100 and n is 0.1 to 100; and A represents the following formula [2] or [3].

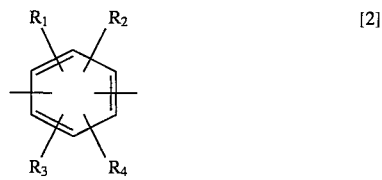

wherein $R_1$ to $R_4$ each represent a hydrogen atom or an alkyl group having 1 to 4 carbon atoms,

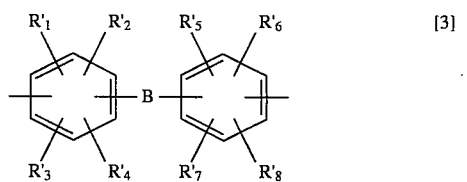

wherein $R_1'$ to $R_8'$ each and independently represent a hydrogen atom or an alkyl group having 1 to 4 carbon atoms; and B represents a single bond, —$CH_2$—, —$C(CH_3)_2$—, —$SO_2$—, —SO—, —CO—, —S— or —O—.

Urethane modified epoxy resins are described for example in the U.S. Pat. No. 5,112,932 and in the Japanese Kokai Hei 5-43655.

The introduction of oxazolidone ring can be achieved in substantially stoichiometric amount by reacting a glycidyl compound with an isocynate compound in the presence of an oxazolidone ting forming catalyst. For example, the isocyanate compound and the glycidyl compound are reacted at an equivalent ratio of the former to the latter of 1:1 to 1:10 to obtain an oxazolidone ring-containing epoxy resin.

If the amount of the isocyanate compound employed is smaller than the specified range, the amount of the oxazolidone rings will be insufficient, leading to reduction in the effect of improving heat resistance, failure of improving storage stability, of exhibiting the flame retardancy to be brought about synergistically with a halogen-containing resin to be described later, and of reducing the halogen content of the composition. Meanwhile, if the amount of the isocyanate compound is greater than the specified range, waterproofness of the resulting composition will be reduced.

The glycidyl compound must be added in a predetermined amount so as to secure heat resistance and adhesion.

The raw material glycidyl compound to be employed for preparing the component (A) resin includes, for example, glycidyl ethers, glycidyl esters, glycidyl amines, linear aliphatic epoxides and cycloaliphatic epoxides.

The glycidyl ethers include, for example, bisphcnol diglycidyl ethers, novolak polyglycidyl ethers and alkyl glycidyl ethers.

These glycidyl ethers can typically be exemplified by compounds obtained by glycidylation of divalent phenols such as bisphenol A, bisphenol F, bisphenol AD, bisphenol S, tetramethyl bisphenol A, tetramethyl bisphenol F, tetramethyl bisphenol AD, tetramethyl bisphenol S and dihydroxynaphthalene, biphenols such as 4,4'-biphenol and 3,3',5,5'-tetramethyl-4,4'-biphenol and also compounds obtained by glycidylation of tris(glycidyloxyphenyl)alkanes or aminophenols, such as 1,1,1-tris(4-hydroxyphenyl)methane, 1,1, 1-(4-hydroxy-phenyl)ethane, 4,4'-[1-[4-[1-(4-hydroxyphenyl)-1-methylethyl]phenyl]ethylidene]bisphenol.

The glycidyl ethers also include compounds obtained by glycidylation of novolaks such as phenol novolak and cresol novolak.

Meanwhile, glycidyl esters include, for example, diglycidyl esters of hexahydrophthalic acid and diglycidyl esters of dimer acids. The linear aliphatic epoxides include, for example, epoxidized polybutadiene and epoxidized soybean oil.

The cycloaliphatic epoxides include, for example, 3,4-epoxy-6-methylcyclohexyl carboxylate and 3,4-epoxycyclohexyl carboxylate.

In addition to the compounds listed above, the glycidyl compounds described in H. Kakiuchi's "SHIN-EPOXY JUSHI (New Epoxy resins)" (published by Shokodo, 1985), pp. 49–104 and the glycidyl compounds described in H. Kakiuchi's "EPOXY JUSHI-SAIKIN NO SHINPO (Epoxy Resins—Recent Advancement)" (published by Shokodo, 1990), pp. 21–46 can also be given.

While the raw material glycidyl compound for the component (A) resin may not be limited to those exemplified above, diglycidyl ethers of divalent phenols, particularly bisphenol A diglycidyl ether, are preferred among others.

These raw material glycidyl compounds may be used singly or as a combination of two or more of them.

The raw material isocyanate compound for obtaining the component (A) resin nonlimitatively includes, for example, bifunctional isocyanate compounds such as methanediisocyanate, butane-1,1-diisocyanate, ethane-1,2-diisocyanate, butane-1,2-diisocyanate, transvinylenediisocyanate, propane-1,3-diisocyanate, butane-1,4-diisocyanate, 2-butene-1,4-diisocyanate, 2-methylbutene-1,4-diisocyanate, 2-methylbutane-1,4-diisocyanate, pentane-1,5-diisocyanate, 2,2-dimethylpentane-1,5-diisocyanate, hexane-1,6-diisocyanate, heptane-1,7-diisocyanate, octane-1,8-diisocyanate, nonane-1,9-diisocyanate, decane-1,10-diisocyanate, dimethylsilanediisocyanate, diphenylsilanediisocyanate, ω, ω'-1,3-dimethylbenzenediisocyanate, ω, ω'-1,4-dimethylbenzenediisocyanate, ω, ω'-1,3-dimethylcyclohexanediisocyanate, ω, ω'-1,4-dimethylcyclohexanediisocyanate, ω, ω'-1,4-dimethylnaphthalenediisocyanate, ω, ω'-1,5-dimethylnaphthalenediisocyanate, cyclohexane-1,3diisocyanate, cyclohexane-1,4-diisocyanate, dicyclohexylmethane-4,4'-diisocyanate, 1,3-phenylenediisocyanate, 1,4-phenylenediisocyanate, 1-methylbenzene-2,4-diisocyanate, 1-methylbenzene-2,5-diisocyanate, 1-methylbenzene-2,6-diisocyanate, 1-methylbenzene-3,5-diisocyanate, diphenylether-4,4'-diisocyanate, diphenylether-2,4'-diisocyanate, naphthalene-1,4-diisocyanate, naphthalene-1,5-diisocyanate, biphenyl-4,4'-diisocyanate, 3,3'-dimethylbiphenyl-4,4'-diisocyanate, 2,3'-dimethoxybiphenyl-4,4'-diisocyanate, diphenyl-methane-4,4'-diisocyanate, 3,3'-dimethoxydiphenylmethane-4,4'-diisocyanate, 4,4'-dimethoxydiphenylmethane-3,3'-diisocyanate, dimethoxydiphenylmethane-3, 3'-diisocyanate, diphenylsulfite-4,4'-diisocyanate and diphenylsulfone-4,4'-diisocyanate; polyfunctional isocyanate compounds such as polymethylene polyphenylisocyanate, triphenylmethanetriisocyanate and tris(4-phenylisocyanate-triophosphate)-3,4',4,4'-diphenylmethanetetraisocyanate; and multi-polymers such as dimers and trimers of the above isocyanate compounds; and block isocyanate and hisurethane compounds masked by alcohols or phenols. These isocyanate compounds may also be used as a combination of two or more of them.

Of the raw material isocyanate compounds for the component (A) resin, preferred are the bifunctional or trifunctional isocyanate compounds, and the bifunctional isocyanate compounds are more preferred.

If the functionality of the isocyanate compound is too great, storage stability of the resulting composition will be reduced; whereas if it is too small, the resulting composition cannot exhibit heat resistance.

Of these compounds, readily available isocyanate compounds represented by the general formula (4) or (5) are preferably used:

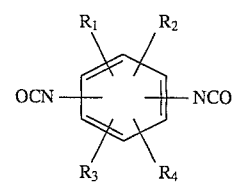

[4]

-continued

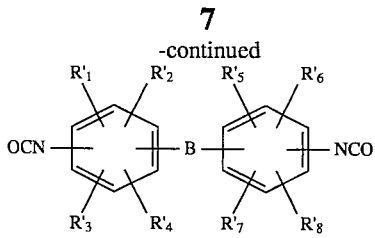

wherein $R_1$ to $R_4$ each represent a hydrogen atom or an alkyl group having 1 to 4 carbon atoms and $R_1'$ to $R_8'$ each and independently represent a hydrogen atom or an alkyl group having 1 to 4 carbon atoms, and B represents a single bond, $-CH_2-$, $C(CH_3)_2-$, $-SO_2-$, $-SO-$, $-CO-$, $-S-$ or $-O-$.

The component (A) resin can be prepared, for example, in the presence of an oxazolidone ring forming catalyst.

As the oxazolidone group forming catalyst, those which allow formation of oxazolidone ring selectively in the reaction between a glycidyl compound and an isocyanate compound are preferred.

As the catalyst which allows formation of oxazolidone ring in the above reaction can be exemplified by lithium compounds such as lithium chloride and butoxy lithium; complex salts of boron trifluoride; quaternary ammonium salts such as tetrabutylammonium bromide, iodide or chloride, tetramethyl ammonium chloride, tetramethylammonium bromide and tetramethylammonium iodide; tertiary amines such as dimethylaminoethanol, triethylamine, tributylamine, benzyldimethylamine and N-methylmorpholine; phosphines such as triphenylphosphine; phosphonium compounds such as amyltriphenylphosphonium bromide, diallyldiphenylphosphonium bromide, ethyltriphenylphosphonium chloride, ethyltriphenylphosphonium iodide, tetrabutylphosphonium acetate-acetic acid complex, tetrabutylphosphonium acetate, tetrabutylphosphonium chloride, tetrabutylphosphonium bromide and tetrabutyl iodide; a combination of triphenyl antimony and iodine; and imidazoles such as 2-phenylimidazole and 2-methylimidazole. While these catalysts may be used singly or as a combination of two or more of them, the oxazolidone ring forming catalyst employable in this invention may not be limited to them. Quaternary ammonium salts are preferred, in particular tetrabutylammonium bromide and tetramethylammonium chloride or iodide.

The oxazolidone group forming catalyst is used in an amount in the range of 5 ppm to 20'000 ppm relative to the raw material employed, preferably 10 to 10'000 ppm, more preferably 20 to 5000 ppm, still more preferably 20 to 1000 ppm. If the catalyst is added in an amount exceeding the specified level, it remains as an impurity in the resulting resin to cause reduction in the insulating property and moisture resistance of the resulting resin composition when used for the above-described applications, particularly as the laminate and sealing materials; whereas if the catalyst is added in an amount smaller than the specified level, the efficiency of obtaining the desired resin will be lowered. In order to remove the catalyst, the epoxy resin of the invention may be filtered using a suitable solvent which substantially does not dissolve the catalyst.

The component (A) resin can also be prepared in the presence of a suitable solvent which can dissolve the component (A) resin.

When a solvent is to be employed, an inert solvent, for example, N-dimethylformamide, N,N-diethylformamide, N-methyl-2-pyrrolidone, dimethylsulfoxide, dimethylphosphoramide, methyl ethyl ketone, xylene, toluene, methyl cellosolve and tetrahydrofuran; tetrahydrofuran is preferred.

The component (B) resin in the resin composition of the invention means a halogen-containing resin having at least one epoxy group on an average per molecule and includes, for example, resins obtained by glycidylation of tetrabromobisphenol A, tetrachlorobisphenol A, tetrachlorobisphenol A, brominated phenol novolak or brominated bisphenol A novolak; the halogen-containing epoxy resins described in H. Kakiuchi's "EPOXY JYUSHI-SAIKIN NO SHINPO (Epoxy Resins-Recent Advancement)" (published by Shokodo, 1990), pp. 34–37; and also epoxy resins having halogen atoms on the aromatic rings.

These compounds may be used singly or as a combination of two or more of them.

The resin composition of the invention has high flame retarding effect because of the halogen contained in the component (B) resin, and the flame retardancy is synergistically enhanced by the oxazolidone ring contained in the component (A) resin.

The halogen is preferably bromine in view of flame retarding effect to be exhibited.

The halogen is contained in the component (B) resin in an amount of 15 to 60 wt %, more preferably 18 to 55 wt %, particularly preferably 30 to 52 wt %.

If the amount of halogen is smaller than the specified level, the flame retardancy is impaired; whereas if it is greater than the specified level, the soldering heat resistance is lowered.

The present resin composition may also contain an epoxy resin having a functionality of 2 or more in addition to the component (A) resin and the component (B) resin, without departing from the gist of the invention.

When the present resin composition is used in combination with an arbitrary amount of an epoxy resin having a functionality of 2 or more, ratio of the IR absorption intensity attributable to the isocyanurate assumed to be present in the oxazolidone ring-containing epoxy resin to the IR absorption intensity attributable to the oxazolidone rings may preferably be regulated to 0.1 or less based on the total epoxy resin content except for the component (C) resin. The reason is because the storage stability of the resulting resin composition of the invention can further be enhanced when it is stored in the form of a vanish or a prepreg.

The ratio of the IR spectrophotometrically determined absorption intensity at the wave number of 1710 $cm^{-1}$ attributable to the isocyanurate ring to the absorption intensity at the wave number of 1750 $cm^{-1}$ is deskably regulated to a value of 0.1 or less based on the total epoxy resin content employed except for the component (C).

The component (A) resin can be prepared by charging a predetermined amount of raw material epoxy resin in a reactor, followed by heating to adjust the temperature of the system to a predetermined level. Subsequently, a catalyst is charged as such or as dissolved in water or a suitable solvent at a temperature of 20° to 200° C., preferably at 80° to 200° C., more preferably 110° to 180° C., particularly preferably at 120° to 160° C.

If the catalyst is charged at a temperature below the specified range, the reaction between the epoxy groups and the intramolecular secondary alcoholic groups is accelerated before reaching the specified reaction temperature to lower the epoxy group concentration. If the catalyst is charged at a temperature above the specified range, the reaction is liable to proceed too quickly.

Subsequently, the isocyanate compound is dropped at one time or in several portions stepwise or continuously. Usually, the dropping is preferably carried out at least over 30 minutes, more preferably 1 to 10 hours, particularly preferably 2 to 5 hours. If the dropping time is shorter than the specified range, the resulting resin comes to have a high IR intensity ratio; whereas if it is longer than the specified range, the resulting resin comes to have a lowered epoxy concentration, in turn, reduced performance and storage stability.

The reaction is usually carried out in a temperature range of 20° to 300° C., preferably 60° to 250° C., more preferably 120° to 230° C., still more preferably 140° to 220° C., particularly preferably 140° to 200° C.

If the reaction is carried out at a temperature higher than the specified range, deterioration of the resin is liable to be caused; whereas if the reaction is carried out at a temperature lower than the specified range, not only the reaction may not fully be completed, but also the resulting resin comes to contain a large amount of triisocyanurate rings, unfavorably. Accordingly the resulting resin comes to have poor moisture resistance, an IR intensity ratio of more than 0.1, reduced storage stability, in turn, reduced adhesion, reduced waterproofing property, etc.

Meanwhile, the reaction is preferably completed to give a specified IR intensity ratio which is not higher than 0.1.

Next, the component (B) is added.

The weight ratio of the component (A) resin to the component (B) resin is 5–100:95–0, and if flame retardancy is to be imparted, the ratio is 5–95:95–5, preferably 10–90:90–10, more preferably 20–80:80–20, particularly preferably 30–70:70–30; especially 40–60:60–40.

If the amount of the component (A) resin is greater than the specified level, the resulting composition comes to have reduced flame retardancy; whereas if it is smaller than the specified level, the resulting composition comes to have reduced heat resistance.

The total amount of the hydrolizable chlorine in the combined epoxy resin composition obtained by mixing the component (A) resin and the component (B) resin is preferably 500 ppm or less, more preferably 200 ppm or less, still more preferably 100 ppm, particularly preferably 50 ppm or less, especially 30 ppm or less.

The hydrolizable chlorine if contained in the epoxy resin composition in an amount greater than the specified level will cause reduction of heat resistance, corrosion of gold, silver, copper, aluminum, etc. employed as a conductor material in the circuits and the like, leading to reduction in the insulating property. Accordingly, the resulting resin will be unusable as an electric or electronic material.

Further, the total content of the α-glycol groups in the combined epoxy resins used as the resin composition of the invention is preferably 100 meq/kg or less, more preferably 50 meq/kg or less, still more preferably 30 meq/kg or less, particularly preferably 20 meq/kg or less.

If the content of the α-glycol groups represented by the general formula [6] in the epoxy resin composition is greater than the specified range, defects such as formation of network structure in the cured product may be caused, leading to reduction in the waterproofing property. Accordingly, the resulting composition may not be usable as the electronic materials for laminates and sealings, or composite materials, FRTS, etc.

[6]

The curing agent employable in the present resin composition is selected from those having excellent heat resistance and includes nonlimitatively, for example, aromatic amines, dicyandiamide, tertiary amines, imidazoles and phenol resins.

For example, in the case of a laminate resin composition, a curing agent which can effectively impart heat resistance preferably includes dicyandiamide and aromatic amines.

The aromatic amines can be exemplified by meta-phenylene-diamine, para-phenylenediamine, 3,3'-diaminodiphenyl-sulfone, 4,4'-diaminodiphenylsulfone, 4,4'-diamindiphenyl-methane and 4,4'-diaminodiphenyl ether.

The curing agent is used in an arbitrary amount relative to the total amount containing the present epoxy resin composition, usually in an amount of 0.1 to 90 wt %, preferably in an amount of 0.1 to 50 wt %, particularly in a suitable amount depending on the curing agent employed.

For example, in the case of an amine curing agent, it is preferably added in an amount of 1 to 90 wt % relative to the total amount containing the present epoxy resin composition, more preferably in an amount of 1 to 50 wt %. In the case of a dicyandiamide, it is preferably added in an amount of 0.1 to 90 wt % based on the total amount of the present epoxy resin composition, more preferably in an amount of 0.1 to 50 wt %, particularly preferably in an amount of 0.1 to 10 wt %.

If the amount of the curing agent is greater than the specified range, the heat resistance of the epoxy resin may not be exhibited; whereas if it is smaller than the specified range, the resin composition may insufficiently be cured.

An epoxy resin varnish can be prepared by dissolving the present resin composition in a solvent. As the solvent, for example, acetone, methyl ethyl ketone, methyl cellosolve, methyl isobutyl ketone or dimethylformamide can be employed.

An epoxy resin varnish can also be prepared by additionally incorporating a curing accelerator. The curing accelerator includes, for example, imidazoles, tertiary amines, phosphines and aminotriazoles. The resin concentration of the epoxy resin varnish may arbitrarily be decided depending on the application.

For example, when a laminate is to be prepared, webs such as of glass fabric and the like are impregnated with the thus prepared epoxy resin varnish by conventional procedures, followed drying under heating. The varnish viscosity during impregnation must be maintained at a constant level.

Subsequently, the epoxy resin is semicured to form epoxy resin prepregs. During the storage time after preparation of the prepregs to formation of laminates, the quality of the prepregs must be maintained at a constant level.

Thereafter, several sheets of epoxy resin prepregs thus obtained are laminated, and a metal foil such as a copper foil is, if necessary, clad thereon, followed by pressure molding under heating to effect curing of the epoxy resin and give a laminate.

Meanwhile, the varnish is used as a coating material, a coloring agent such as titanium oxide, carbon black, calcium carbonate, talc, clay, barium sulfate and organic pigments, a filler, a leveling agent, a cissing preventive, a defoaming agent, etc. may be added in addition to the present resin composition. The resulting composition can be applied, dried and cured by conventional procedures to obtain excellent coating films.

To the resin composition of the invention, a coloring agent, a filler, a leveling agent, etc. may, if necessary, be added, and the resulting mixture can be blended homogeneously over a tumbler, a blender, a Henschel mixer, a roll mill, etc. by conventional procedures using no or substantially no solvent for such applications as a powder coating, a sealing agent or a molding material. The resulting homogenized mixture can be applied or cured and molded by conventional procedures, for example, by transfer molding, casting and dipping.

Meanwhile, the resin composition of the invention can also be used as an adhesive or a civil engineering and building materials, etc. having fluidity, by further incorporating thereto a liquid material having reactivity with the components in the present composition and, if necessary, a solvent, a coloring agent or a filler.

The resin composition of the invention may also be incorporated, if necessary, with a reinforcing carrier. Suitable reinforcing materials include, for example, glass fiber, carbon fiber, Kevlar, boron, calcium carbonate, talc, alumina and asbestos. The reinforcing material is generally used in an amount of about 40 to 95 wt % relative to the total weight of the composition, usually in an amount of about 60 to 80 wt %.

The present resin composition can be applied in the form of melt or solution to fiber reinforced materials by a method known in the art. The fiber reinforced materials coated with the present resin composition, i.e. prepregs, are then subjected to pressure molding under heating to be completed into a structural composite material.

The thus obtained composition comprising an oxazolidone ring-containing epoxy resin, a halogen-containing epoxy resin and a curing agent can suitably be employed as an epoxy resin composition having both flame retardancy and storage stability as well as heat resistance and tenacity.

Next, the present invention is explained in more detail by way of the following examples. The invention is by no means limited by these examples. In the examples, characteristic properties were measured according to the following methods:

(1) Epoxy equivalent

This is mass of resin containing 1 gram equivalent of epoxy group. It was determined according to JIS K-7236 (Japan Industrial Standard).

(2) α-Glycol content

Three grams of sample were dissolved into 25 ml of chloroform. After adding 25 ml of a solution of benzyltrimethylammonium periodate, it was reacted for 2.5 hours. After adding 5 ml of 2N aqueous sulfuric acid and 15 ml of 20% aqueous solution of potassium iodide, the mixture was titrated with 0.1N solution of sodium thiosulfate.

(3) Content of hydrolizable chlorine

Three grams of sample were dissolved into 50 ml of toluene. After adding thereto 20 ml of 0.1N methanolic solution of KOH and boiling the mixture for 15 minutes, it was titrated with silver nitrate to determine total chlorine content. On the other hand, inorganic chlorine content was determined by dissolving the same sample as above into toluene and titrating it with silver nitrate. By subtracting the inorganic chlorine content from the total chlorine content, the content of hydrolizable chlorine was determined.

(4) Bromine content

Sample (0.1 g) was dissolved into 15 ml of dimethylformamide. After adding thereto 0.4 g of palladium-carbon catalyst and 10 ml of a solution of sodium borohydride ($NaBH_4$ 6 g/2N NaOH aq. 100 ml) and reacting them at 150° C. for 2 hours, 20 ml of pure water, 120 ml of acetic acid and 300 ml of methyl ethyl ketone were added and the whole was titrated with silver nitrate.

(5) Glass transition temperature (Tg)

EXAMPLE 1–6

A varnish was cured in oven at 170° C. for 60 minutes, after which Tg was measured by means of DSC (DSC 220 manufactured by SEIKO). Further, after storing the varnish at 30° C. for 30 days, the same measurement as above was repeated.

EXAMPLE 7

A varnish was cured in oven at 180° C. for 2 hours and a sample was collected from a cured plate, after which Tg was measured by means of DSC (DSC 220 manufactured by SEIKO).

(6) Storage stability of varnish

Viscosity of a varnish just after preparation was taken as initial varnish viscosity. Viscosity of the varnish after storing it at 40° C. for 14 days was taken as varnish viscosity after storage. Storage stability of the varnish was determined from the following formula:

$$\frac{\text{Varnish Viscosity after storage}}{\text{Initial varnish Viscosity}}$$

For the measurement of viscosity, a B viscometer was used.

(7) Gel time maintenance

Just after preparation of prepreg, resin was squeezed out of the prepreg and its gel time was measured. It was taken as initial gel time. On the other hand, prepreg was stored at 25° C. for 90 days and then resin was squeezed out and its gel time was measured. It was taken as gel time after storage. Gel time after storage divided by initial gel time was taken as gel time maintenance, in terms of per cent.

$$\frac{\text{Gel time after storage}}{\text{Initial gel time}} \times 100$$

Gel time was measured by placing sample on a hot plate kept at 160° C., bringing tip of a bamboo-spatula into contact with the sample and raising the spatula vertically up to a height of 5 cm. The period by the time when the sample had become giving an unbroken filament was taken as gel time.

(8) Solder heat resistance

A laminate board was dipped for 30 seconds in a solder bath kept at a prescribed temperature, after which the swelling on the surface of laminate was visually examined. Criterion of the evaluation was as follows:

o: No swelling; Δ: Area of swelling smaller than 10%; x: Area of swelling 10% or above. In an additional test, a laminate board was dipped in boiling water for one hour, and thereafter the same test as above was repeated.

(9) Copper foil peeling strength

The strength exhibited at the time of vertically peeling off copper foil from laminate board was measured by means of a tensile tester (Autograph AG-5000D, manufactured by Shimazu Seisakusho).

(10) Flame retardance

It was measured according to UL Standard (UL-94).

(11) IR intensity ratio

Sample was dissolved into tetrahydrofuran (THF) to prepare a solution having a sample concentration of 10% by weight. The THF solution (30 gl) was taken and dropped onto the cell (made of KRS-5) of infrared spectrophotometer, and the THF was evaporated off by means of a drier. The sample was covered with another cell made of KRS-5 of infrared spectrophotometer so that the sample was held between the two cells. By means of Fourier conversion type infrared spectrometer (FT-IR 1640, PERKIN ELMER), an infrared absorption spectrum was measured at an integration number 64.

In this infrared absorption spectrum, the straight line linking the peak of wavenumber 1695 $cm^{-1}$ and the peak of wavenumber 1790 $cm^{-1}$ was taken as base line. From the maximum absorption due to isocyanurate ring (1700 $cm^{-1}$ to 1715 $cm^{-1}$), the absorption of base line at the same wave number was deducted, and the residue was taken as IR-1 (referred to as absorption as 1710 $cm^{-1}$). From the maximum absorption at a wave number of 1730 $cm^{-1}$ to 1770 $cm^{-1}$, the absorption of base line at the same wave number was deducted, and the residue was taken as IR-0 (referred to as absorption at 1750 $cm^{-1}$). IR intensity ratio is expressed by the following formula:

$$IR \text{ intensity ratio} = \frac{IR-1}{IR-0}$$

(12) Shearing strength: according to ASTM D-1002
(13) T peeling strength: according to ASTM K-903
(14) Tensile strength: according to JIS K-7113
(15) Modulus of elasticity: according to JIS K-7113

REFERENTIAL EXAMPLE 1

The diglycidyl ether used in Production example 1–5 is prepared by reacting Bisphenol A and epichlorohydrin according to known method. The product is named Glycidyl Compound A. Its properties are shown in Table 1.

TABLE 1

| | Epoxy equivalent (g/eq) | α-Gylcol (meq/kg) | Hydrolizable chlorine (ppm) |
|---|---|---|---|
| Glycidyl Compound A | 185 | 20 | 20 |

REFERENTIAL EXAMPLE 2

The high-bromine type epoxy resin used in Production example 1–5 is prepared by reacting Tetrabromobisphenol A and epichlorohydrin according to known method. The product is named High-bromine Type Resin A. Its properties are shown in Table 1.

TABLE 2

| | Bromine content (% by wt.) | Epoxy equivalent (g/eq) | α-Gylcol (meq/kg) | Hydrolizable chlorine (ppm) |
|---|---|---|---|---|
| High-bromine Type Resin A | 48.3 | 407 | 20 | 20 |

REFERENTIAL EXAMPLE 3

Low-bromine type epoxy resins are prepared by reacting the glycidyl compound of Referential Example 1 and Tetrabromobisphenol A and epichlorohydrin according to known method. The resin properties of the low-bromine Type epoxy resins thus obtained are shown in Table 3.

TABLE 3

| | Bromine content (% by wt.) | Epoxy equivalent (g/eq) | a-Gylcol (meq/kg) | Hydrolizable chlorine (ppm) |
|---|---|---|---|---|
| Low-bromine Type Resin B | 21.0 | 493 | 10 | 10 |
| Low-bromine Type Resin C | 24.5 | 682 | 8 | 8 |

Next, production examples of the oxazolidone ring-containing epoxy resin and halogencontaining epoxy resin constituting the resin composition of the present invention are shown below.

In the following production Examples 1 to 6, parts mean grams.

PRODUCTION EXAMPLE 1

One hundred parts of Sample A are charged into a 300 ml round-bottom flask equipped with a stirrer, a thermometer and a heater. While stirring it, 0.5 part of tetramethylammonium iodide is added. Then, the content of the flask is heated with stirring until its temperature reaches 175° C., and 15 parts of Millionam MT (MDI; 4,4'-diphenylmethane diisocyanate, manufactured by Japan Polyurethane Co.) are added thereto over a period 120 minutes. After adding it, the resulting mixture is reacted for 3 hours with stirring at a constant reaction temperature of 175° C. Then, 69 parts of High-bromine Type Epoxy Resin A are added, and the whole mixture is stirred at 120° C. for one hour. The product thus obtained is named Resin Composition E.

PRODUCTION EXAMPLE 2

Production Example 1 is repeated, except that Millionate MT is used in an amount of 25 parts and High-bromine Type Resin A is used in an amount of 75 parts. The product thus obtained is named Resin Composition F.

PRODUCTION EXAMPLE 3

Production Example 1 is repeated, except that Millionate MT is used in an amount of 30 parts and High-bromine Type Resin A is used in an amount of 78 parts. The product thus obtained is named Resin Composition G.

PRODUCTION EXAMPLE 4

Into a 300 ml round-bottom flask equipped with a stirrer, a thermometer and a heater are charged 100 pans of Sample A, 29 parts of Millionate MTL (MDI liquid at ambient temperature; partially carbodiimidated 4,4'-diphenylmethane diisocyanate, manufactured by Japan Polyurethane Co.) and 0.5 part of tetramethylammonium iodide. The content of the flask is heated and kept at a reaction temperature of 175° C. for 3 hours with stirring. Then, 77 parts of High-bromine Type Epoxy Resin A are added, and the whole mixture is stirred at 120° C. for one hour. The product thus obtained is named Resin Composition H.

PRODUCTION EXAMPLE 5

Production Example 4 is repeated, except that Millionate MTL is replaced with 17 pans of Colonate T-100 (TDI manufactured by Japan Polyurethane Co. 2,4-tolylene diisocyanate 95% or above, 2,6-tolylene diisocyanate 5% or below) and High-bromine Type Resin A is used in an amount of 90 parts. The product thus obtained is named Resin Composition I.

PRODUCTION EXAMPLE 6

Into a 300 ml round-bottom flask equipped with a stirrer, a thermometer and a heater are charged 100 parts of Sample A, and 0.1 parts of tetramethylammonium iodide are added with stirring. Then the content of the flask is heated and kept at an inner temperature of 175° C. with stirring and 16 parts of Colonate T-80 (TDI manufactured by Japan Polyurethane Co. about 80% of 2,4-tolylene diisocyanate; about 20% of 2,6-tolylene diisocyanate) are added during 120 minutes. Mter the addition, the whole mixture is stirred for 3 hours while keeping the reaction temperature of 175° C. The product thus obtained is named Resin Composition J. Properties of the Composition E-J consisting of an oxazolidone epoxy resin obtained in Production Examples 1–6 are summarized in Table 4.

TABLE 4

| | Epoxy equivalent (g/eq) | α-Gylcol (meq/kg) | Hydrolizable chlorine (ppm) | Bromine content (% by wt) |
|---|---|---|---|---|
| Resin Composition E | 306 | 15 | 16 | 18.0 |
| Resin Composition F | 376 | 14 | 14 | 17.9 |
| Resin Composition G | 418 | 12 | 12 | 18.1 |
| Resin Composition H | 383 | 13 | 10 | 18.0 |
| Resin Composition I | 360 | 17 | 18 | 21.0 |
| Resin Composition J | 331 | 10 | 35 | 0 |

EXAMPLE 1–5

Using each of Resin Compositions E-I obtained in Production Examples 1–5, epoxy resin varnishes are prepared according to the formulations shown in Table 5. The amounts given in Table 5 mean "parts by weight". Each of the varnishes applied and impregnated into a glass cloth (216L manufactured by Asahi Schoeber Co., treated with AS450, 0.1 mm in thickness) and dried at 160°. Thus, prepregs having a resin content of about 40% are obtained. After superposing 8 sheets of each prepreg thus obtained, a copper foil having a thickness of 35μ is placed on both sides, the whole is molded with heat and pressure at a temperature of 170° C. under a pressure of 30 kg/cm² over a period of 60 minutes. Thus, copper-lined laminate boards are obtained.

COMPARATIVE EXAMPLES 1–3

Using each resin shown in Table 5, an epoxy resin varnish is prepared according to the formulation shown in Table 5. Subsequently, copper-lined laminates are prepared therefrom by the same procedure as in Example 1–5. Properties of the cured products, varnishes, prepregs and laminate boards obtained in the Examples and Comparative examples are summarized in Table 6.

EXAMPLE 6

The properties of the composition are evaluated after curing each epoxy resin composition shown in Table 7. The amounts given in Table 7 mean "parts by weight".

EXAMPLE 7

Equivalent of resin composition J and curing agent DDS (4,4'-diaminodiphenylsulfone) are mixed and cured at 180° C. for 2 hours. The amounts given in Table 8 means "parts by weight". Samples are cut from the obtained cured plate and properties thereof are evaluated. As comparative examples, the composition containing ARALDITE GY 260 (Bisphenol A type epoxy resin; manufacturing by Ciba-Geigy Ltd.) instead of resin composition J are tested in the same manner as the mentioned above. Results are shown in Table 8.

TABLE 5-1

| | Example 1 | Example 2 | Example 3 | Example 4 | Example 5 |
|---|---|---|---|---|---|
| Resin Composition E | 100 | | | | |
| Resin Composition F | | 100 | | | |
| Resin Composition G | | | 100 | | |
| Resin Composition H | | | | 100 | |
| Resin Composition I | | | | | 100 |
| High-bromine Type Resin B | | | | | |
| Low-bromine Type Resin C | | | | | |
| Low-bromine Type Resin D | | | | | |
| GY 250*1 | | | | | |
| BCN 299*2 | | | | | |
| Dicyandiamide | 4.1 | 3.4 | 3.0 | 3.3 | 3.5 |
| 2-Ethyl-4-methylimidazole | 0.2 | 0.2 | 0.2 | 0.2 | 0.2 |
| Dimethylformamide | 20 | 20 | 20 | 20 | 20 |
| Methyl cellosolve | 20 | 20 | 20 | 20 | 20 |
| Methyl ethyl ketone | 20 | 20 | 20 | 20 | 20 |

TABLE 5-2

| | Comparative Example 1 | Comparative Example 2 | Comparative Example 3 |
|---|---|---|---|
| Resin Composition E | | | |
| Resin Composition F | | | |
| Resin Composition G | | | |
| Resin Composition H | | | |

TABLE 5-2-continued

|  | Comparative Example 1 | Comparative Example 2 | Comparative Example 3 |
|---|---|---|---|
| Resin Composition I |  |  |  |
| High-bromine Type Resin B | 43 |  |  |
| Low-bromine Type Resin C |  | 100 |  |
| Low-bromine Type Resin D |  |  | 86 |
| GY 250*[1] | 57 |  |  |
| BCN 299*[2] |  |  | 14 |
| Dicyandiamide | 5.2 | 2.6 | 2.4 |
| 2-Ethyl-4-methyl-imidazole | 0.2 | 0.2 | 0.2 |
| Dimethylformamide | 20 | 20 | 20 |
| Methyl cellosolve | 20 | 20 | 20 |
| Methyl ethyl ketone | 20 | 20 | 20 |

*[1] Bisphenol A type epoxy resin, epoxy equivalent 185, hydrolizable chlorine content 500 ppm, α-glycol 70 meq/kg; manufactured by Ciba-Geigy Ltd.
*[2] Epoxy cresol novolac, epoxy equivalent 220 g/eq; manufactured by Asahi Chemical Co.

TABLE 6-1

|  | Example 1 | Example 2 | Example 3 | Example 4 | Example 5 |
|---|---|---|---|---|---|
| IR intensity ratio | 0.03 | 0.07 | 0.05 | 0.12 | 0.16 |
| Bromine content (%) by wt. | 18.0 | 17.9 | 18.1 | 18.0 | 21.0 |
| Tg After preparation of varnish | 150 | 150 | 152 | 147 | 145 |
| (°C.) After stability test of varnish | 150 | 151 | 152 | 148 | 145 |
| Storage stability of varnish (times) | 1.04 | 1.07 | 1.06 | 1.28 | 1.34 |
| Gel time maintenance (%) | 94 | 92 | 90 | 85 | 86 |
| Copper foil peeling strength (kg/cm) | 2.05 | 2.12 | 2.22 | 2.23 | 2.21 |
| Laminate heat resistance Solder 280° C./30 sec | ○ | ○ | ○ | ○ | ○ |
| 290° C./30 sec | ○ | ○ | ○ | ○ | ○ |
| After boiling, 280° C./30 sec | ○ | ○ | ○ | ○ | Δ |
| Flame retardance (UL-94) | V-O | V-O | V-O | V-O | V-O |

TABLE 6-2

|  | Comparative Example 1 | Comparative Example 2 | Comparative Example 3 |
|---|---|---|---|
| IR intensity ratio | — | — | — |
| Bromine content (%) by wt. | 21.0 | 21.0 | 21.0 |
| Tg After preparation of varnish | 134 | 125 | 135 |
| (°C.) After stability test of varnish | 132 | 122 | 133 |
| Storage stability of varnish (times) | 1.36 | 1.52 | 3.20 |
| Gel time maintenance (%) | 84 | 82 | 68 |
| Copper foil peeling strength (kg/cm) | 0.95 | 2.20 | 1.71 |
| Laminate heat resistance Solder 280° C./30 sec | ○ | Δ | ○ |
| 290° C./30 sec | X | X | Δ |
| After boiling, 280° C./30 sec | X | X | X |
| Flame retardance (UL-94) | V-O | V-O | V-O |

TABLE 7

|  | Example 6 (part by w.) | Comparative example 4 (part by weight) |
|---|---|---|
| Resin composition J | 100 |  |
| GY 250*[1] |  | 100 |
| Dicyandiamide | 7 | 7 |
| 2-ethyl-4-methylimidazole | 1 | 1 |

TABLE 7-continued

|  | Example 6 (part by w.) | Comparative example 4 (part by weight) |
|---|---|---|
| Silica (300 mesh) | 50 | 50 |
| Curing condition | 170° C. × 60 (min) |  |
| Shearing strength (Kg/cm²) |  |  |
| 25° C. | 221 | 178 |
| 75° C. | 128 | 95 |
| T-peeling strength (Kg/inch) 25° C. | 18 | 10 |

*Bisphenol A type epoxy resin, epoxy equivalent 185, hydrolizable chlorine content 500 ppm, α-glycol 70 meq/Kg; manufactured by Ciba-Geigy Ltd.

TABLE 8

|  | Example 7 Resin Composition J | Comparative example 5 Novel epoxy resin composition |
|---|---|---|
| Tensile strength (Kg/mm²) | 10.5 | 8.4 |
| Modulus of elasticity (Kg/mm²) | 335 | 270 |
| Tg (C.°) | 230 | 197 |

Comments on examples/Effects of the invention:

Example 6: As it is apparent from the comparison between Example 6 and Comparative Example 4 in Table 7, the composition of Example 6 has higher shearing strength (at normal and elevated temperatures) and higher adhesiveness.

Example 7: It is apparent from the comparison between Example 7 and Comparison Example 5 shown in Table 8, the test compound has better tensile strength, elasticity and heat stability.

As it is apparent from Examples 1–5, the glass transition temperatures (Tg) of the resin compositions of the present invention are unproved by not less than 10° C. in comparison with the comparative examples 1 to 3.

The varnish storage stability of the compositions shown in Examples 1 to 5 are again improved in comparison with the comparative tests. The effect is improved by three times in comparison with comparative test 3 in which a novolak type epoxy resin was used.

Particularly, the varnish storage stability of Examples 1–3 is astonishingly low, i.e. not more than 1.1 times.

In addition, all of the Examples 1 to 5 show that the change of Tg before and after the varnish storage stability test is not more than 1° C.

The storage stability of the prepreg is found good, as the gel time maintenance ratio of the Examples 1 to 5 are always not less than 85%, whereas that of comparative tests 1 to 3 are less than 85%. In particular, Examples 1–3 show amazing figures, i.e. all being more than 90%.

All the resins in the Examples 1 to 5 contain 18% of bromine, which clear V-0.

The solder heat resistance is also found better than the comparison.

The copper foil peeling strength is not less than 2 kg/cm in all the Examples 1 to 5, which proves the good adhesiveness.

All in all, it is clear that the composition of the present invention has excellent heat stability, anti-flaming property and storage stability as a laminate and sealing resin composition.

Further, Examples 6 and 7 show high heat stability and sheafing, T peeling and tensile strength. Thus, the composition is useful as adhesive, IC sealing agent, matrix resin for fiber reinforced plastics, structural material in any field where epoxy resin has been conventionally employed.

I claim:

1. An epoxy resin composition that may have a hydrolyzable chlorine content and an amount of α-glycol, which composition is characterized by comprising (A) an epoxy resin free of halogen substituents and containing an oxazolidone ring which is derived from a glycidyl compound selected from the glycidyl ethers, glycidyl esters, glycidyl amines, linear aliphatic epoxides or cycloaliphatic epoxides, (B) a halogen-containing epoxy resin and (C) a curing agent as its ingredients, wherein the ratio by weight of ingredients (A) to (B) is 5–95:95–5, the hydrolyzable chlorine content of a mixture of, ingredients (A) and (B) is not more than 500 ppm and the amount of α-glycol is not more than 100 meq/kg.

2. An epoxy resin composition of claim 1, wherein said ingredient (C) is dicyandiamide or an aromatic amine.

3. An epoxy resin composition of claim 1, wherein the epoxy resin compound (A) has an epoxy equivalent of 200 to 10000 g/eq.

4. An epoxy resin composition of claim 1, wherein the epoxy resin compound (B) has an epoxy equivalent of 200 to 2000 g/eq.

5. An epoxy resin composition of claim 1, wherein the epoxy resin compound (A) contains an epoxy group functionally of at least one epoxy group per molecule.

6. An epoxy resin composition of claim 1, wherein the epoxy resin compound (B) is a bromine-containing epoxy resin.

7. An epoxy resin composition according to claim 1, wherein the hydrolyzable chlorine content of ingredients (A) and (B) is not more than 200 ppm.

8. An epoxy resin composition according to claim 1, wherein the amount of αglycol is not more than 30 meq/kg.

9. An epoxy resin composition according to claim 5, wherein the epoxy resin compound (A) contains an epoxy group functionally of 1.2 to 5 on an average per molecule.

10. An epoxy resin composition according to claim 1, wherein the epoxy resin of component (A) is represented by the formula (I):

$$\underset{O}{\overset{}{CH_2CHCH_2}} \left[ \left( O - \hspace{-3pt}\bigcirc\hspace{-3pt} - \underset{CH_3}{\overset{CH_3}{C}} - \hspace{-3pt}\bigcirc\hspace{-3pt} - OCH_2\underset{OH}{\overset{}{CHCH_2}} \right)_{\!\!p}\!\! O - \hspace{-3pt}\bigcirc\hspace{-3pt} - \underset{CH_3}{\overset{CH_3}{C}} - \hspace{-3pt}\bigcirc\hspace{-3pt} - OCH_2\underset{O}{\overset{}{CH}} - CH_2 \,\, CH_2 - \underset{O}{\overset{}{CH}} - CH_2 \right]_{\!\!n} \hspace{1cm} (I)$$

$$- O - \hspace{-3pt}\bigcirc\hspace{-3pt} - \underset{CH_3}{\overset{CH_3}{C}} - \hspace{-3pt}\bigcirc\hspace{-3pt} - O \left( CH_2 - \underset{OH}{\overset{}{CH}} - CH_2 O - \hspace{-3pt}\bigcirc\hspace{-3pt} - \underset{CH_3}{\overset{CH_3}{C}} - \hspace{-3pt}\bigcirc\hspace{-3pt} - O \right)_{\!\!m}\!\! CH_2\underset{O}{\overset{}{CHCH_2}}$$

wherein p, m and n each represent an average number of recurring unit; and p is 0 to 100, m is 0 to 100 and n is 0.1 to 100; and A represents the following formula (2) or (3):

(2) a cyclohexane ring with substituents $R_1, R_2, R_3, R_4$ wherein $R_1$ to $R_4$ each represent a hydrogen atom or an alkyl group having 1 to 4 carbon atoms,

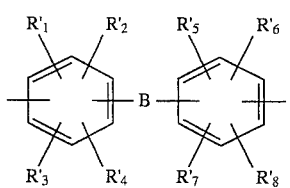
(3)
wherein $R_1'$ to $R_8'$ each and independently represent a hydrogen atom or an alkyl group having 1 to 4 carbon atoms; and B represents a single bond, —$CH_2$—, —$C(CH_3)_2$—, —$SO_2$—, —SO—, —CO—, —S— or —O—.
* * * * *